United States Patent [19]
You

[11] Patent Number: 5,319,253
[45] Date of Patent: Jun. 7, 1994

[54] DATA RETENTION MODE CONTROL CIRCUIT

[75] Inventor: Jei-Hwan You, Suwon, Rep. of Korea

[73] Assignee: Samsung Electronics Co., Ltd., Kyungku-Do, Rep. of Korea

[21] Appl. No.: 985,808

[22] Filed: Dec. 2, 1992

[30] Foreign Application Priority Data

Mar. 13, 1992 [KR] Rep. of Korea ............... 1992-4122

[51] Int. Cl.$^5$ ............... H03K 3/86; H03K 5/14
[52] U.S. Cl. ............... 307/265; 365/194; 365/203; 365/233; 307/590
[58] Field of Search ............ 365/203, 194, 222, 233; 307/590, 596, 530, 265

[56] References Cited

U.S. PATENT DOCUMENTS 5,033,026 7/1991 Tsujimoto ............... 365/222
5,206,830 4/1993 Isobe et al. ............... 365/194

Primary Examiner—Eugene R. LaRoche
Assistant Examiner—Son Mai
Attorney, Agent, or Firm—Hecker & Harriman

[57] ABSTRACT

A semiconductor memory device with data retention function to retain data is provided with a sense amplifier control signal generating circuit comprising a switching circuit controlled by a data retention mode detection signal so as to make the time interval between enabling of a word line and starting of an N- or P-type sense amplifier longer in data retention mode than in normal mode. Thus the inventive circuit generates a sense amplifier control signal whose delay time differs in the normal and data retention modes, so that the data retention mode is performed without influencing the operational speed, the charge sharing is sufficiently achieved in the data retention mode, and the direct current flowing is prevented.

7 Claims, 3 Drawing Sheets

DATA RETENTION MODE CONTROL CIRCUIT

BACKGROUND OF THE INVENTION

1. Field of the Invention

The present invention relates to semiconductor memory devices, and more particularly to a sense amplifier control signal generating circuit for controlling the data retention mode (DR mode).

2. Background Art

In semiconductor memory devices such as dynamic and pseudo-static RAM, a memory cell usually comprises a storage capacitor and an access transistor. Data stored in the storage capacitor suffers a loss of charge after a certain period of time, and therefore requires to be periodically refreshed. The refresh mode periodically refreshes the storage capacitor using a signal external to the semiconductor device. The data retention mode is periodically refreshed by the automatic operation of a timer and refresh-related circuit only if a condition specified for the data retention mode is met. The data retention mode does not require an external signal to periodically control the storing of the data using a low operational voltage (battery voltage) and the device used for the retention mode is necessarily provided in a recently developed semiconductor.

The fundamental cell array and the structure of a sense amplifier of a dynamic RAM are illustrated in FIG. 1. A memory cell array comprising a storage capacitor Cs for storing data and an access transistor M for transferring the stored data to bit lines are shown. N-type and P-type sense amplifiers are connected to a pair of adjacent bit lines BL and BLB. The gate of the access transistor M is connected to the word line signal $\phi$WL produced by a row decoder. An N-type drive transistor Mn is connected to the common node of sensing transistors 3 and 4 of the N-type sense amplifier in order to drive it by receiving a signal $\phi$N. A P-type drive transistor Mp is connected to the common node of sensing transistors 1 and 2 of the P-type sense amplifier in order to drive it by receiving a signal $\phi$P.

A conventional sense amplifier control signal generation circuit is shown in FIG. 2 for controlling the sense amplifiers. The operational voltage waveforms of the circuit shown in FIG. 1 are illustrated in FIG. 3 according to the outputs of FIG. 2. The circuit of FIG. 2 comprises a first delay circuit 10 for delaying and amplifying the word line signal $\phi$WL to generate the signal $\phi$N, and a second delay circuit 20 for inverting and delaying the output of the first delay circuit 10. The delay circuits 10 and 20 may comprise a CMOS inverter, resistor and capacitor.

The operational characteristics of the circuit of FIG. 1 are described with reference to FIG. 3 including the circuit of FIG. 2. The delay path (namely, first and second delay circuits 10 and 20) is used in both the normal and data retention modes, so that the N-type and P-type sense amplifiers have the same sensing time in the normal and retention modes. In this case, after the word line has been enabled, the signal $\phi$N becomes high thereby turning on N-type drive transistor Mn to drive the N-type sense amplifiers 3 and 4. Also, after a delay time at the second delay circuit 20, the signal $\phi$P becomes low turning on the P-type transistor Mp to drive P-type sense amplifiers 1 and 2. The first and second delay circuits 10 and 20 respectively control the time interval t1 between the enabling of the word line and the starting of the N-type sense amplifiers 3 and 4, and the time interval t2 between the starting of the N-type sense amplifiers and the starting of the P-type sense amplifiers 1 and 2. The time interval t1 is taken for charge sharing during which the charge of the storage capacitor Cs is sufficiently transferred to the bit lines. However, it is preferable to keep the time intervals t1 and t2 as short as possible in order to increase the operational speed.

A conventional circuit such as the one shown in FIGS. 1 and 2 causes a problem in the data retention mode. If the time interval t1 is reduced in order to increase the operational speed, the charge sharing time becomes insufficient, causing a failure of the memory cell operation. Also, if the time interval t2 is reduced, a direct current flows from the voltage source terminal Vcc of the N-type sense amplifiers to the ground voltage terminal Vss of the P-type sense amplifiers. The amount of the direct current increases as the time interval t2 is reduced.

SUMMARY OF THE PRESENT INVENTION

It is an object of the present invention to provide a semiconductor memory device to perform the data retention mode without affecting the operational speed.

It is another object of the present invention to provide a semiconductor memory device to secure sufficient charge sharing time in the data retention mode.

It is further another object of the present invention to provide a semiconductor memory device to prevent a direct current flowing from the voltage source terminal Vcc of the N-type sense amplifiers to the ground voltage terminal Vss of the P-type sense amplifiers in the data retention mode.

According to the present invention, a semiconductor memory device with a data retention function to retain data is provided with a sense amplifier control signal generating circuit comprising a switching circuit controlled by a data retention mode detection signal so as to make the time interval between enabling of a word line and starting of an N- or P-type sense amplifier longer in data retention mode than in normal mode.

According to one aspect of the present invention, a semiconductor memory device with a data retention function to retain data is provided with a sense amplifier control signal generating circuit comprising a switching circuit controlled by a data retention mode detection signal so as to make the time interval between starting of an N-type sense amplifier and starting of a P-type sense amplifier longer in data retention mode than in normal mode. In this case, the data retention mode detection signal is enabled by the operation of an oscillator in the data retention mode.

BRIEF DESCRIPTION OF THE DRAWINGS

For a better understanding of the invention, and to show how the same may be carried into effect, reference will now be made, by way of example, to the accompanying diagrammatic drawings, in which.

DETAILED DESCRIPTION OF THE PRESENT INVENTION

Figure 4:
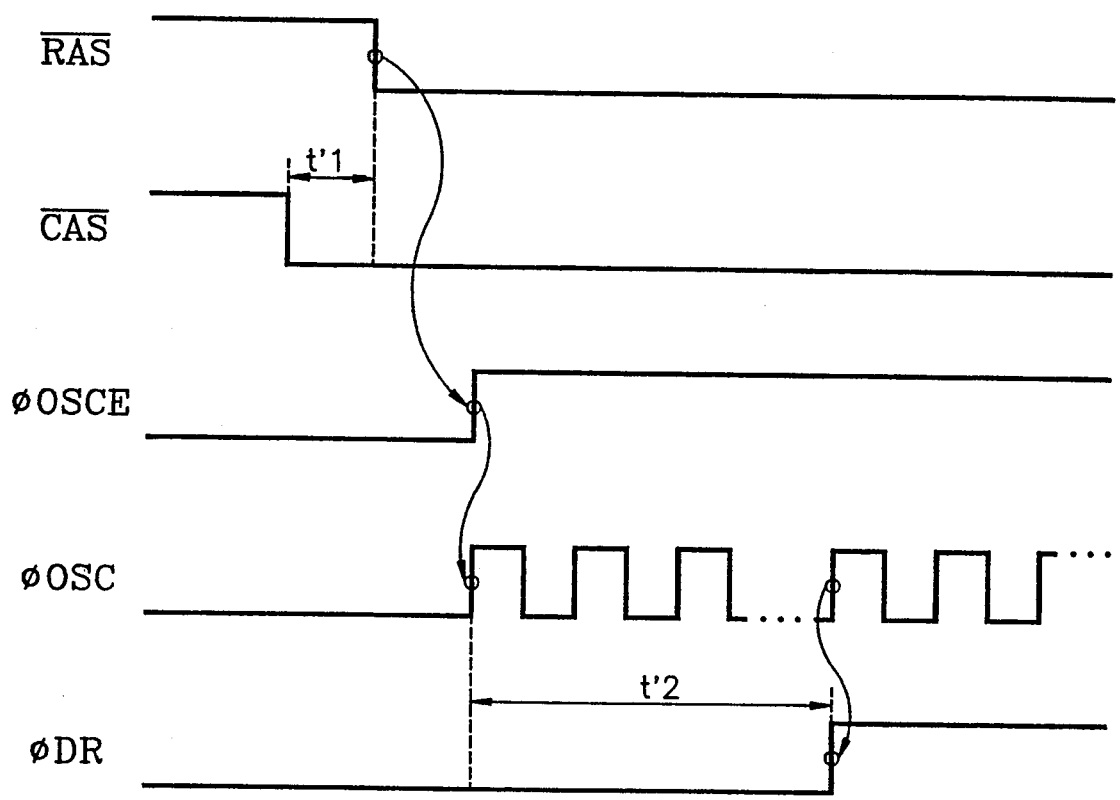
FIG. 4 is the operational timing diagram of the data retention mode detection signal.

The data retention mode detection signal $\phi DR$ will be described with reference to FIG. 4. If the enabling of $\overline{CAS}$ precedes the enabling of $\overline{RAS}$ (i.e.,t1>0), the enable signal $\phi OSCE$ of the oscillator makes a transition from a low level to a high level, so that the oscillator for generating periodic pulses works to trigger the output signal $\phi OSC$. The data retention mode detection signal $\phi DR$ makes a transition from a low level to a high level when the triggering number count of $\phi OSC$ (or transition number) equals the time interval t2 after the enabling of $\phi OSCE$.

Figure 5:
FIG. 5 is a block diagram according to FIG. 4.

The data retention mode detection signal $\phi DR$ is enabled when the $\overline{CAS}$ before $\overline{RAS}$ state is maintained for a time greater than t2. The time interval t2 is generally 100 $\mu s$. The timing diagram of FIG. 4 is achieved by the circuit shown in FIG. 5 which is well known in the prior art and therefore the description is omitted.

Figure 1:
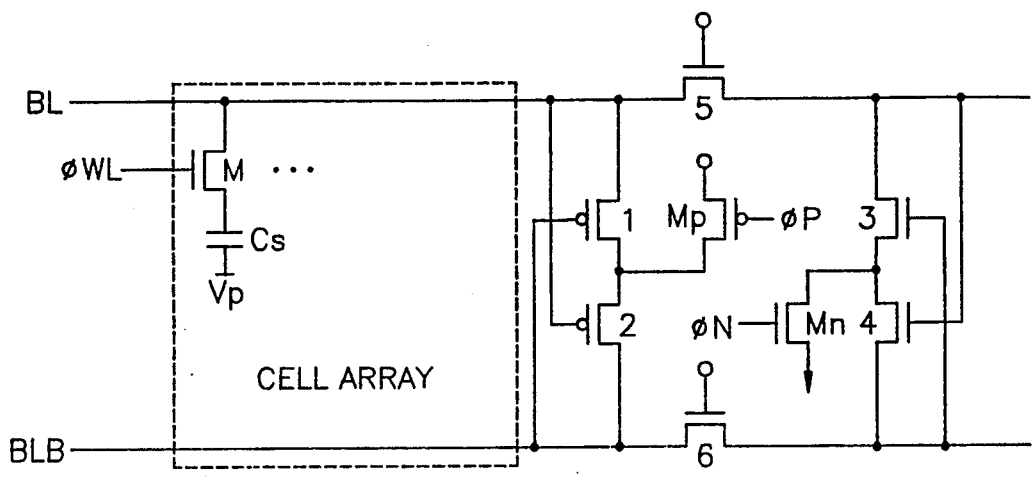
FIG. 1 is a schematic diagram for illustrating the fundamental memory cell array and the structure of the sense amplifiers of a dynamic RAM.
Figure 2:
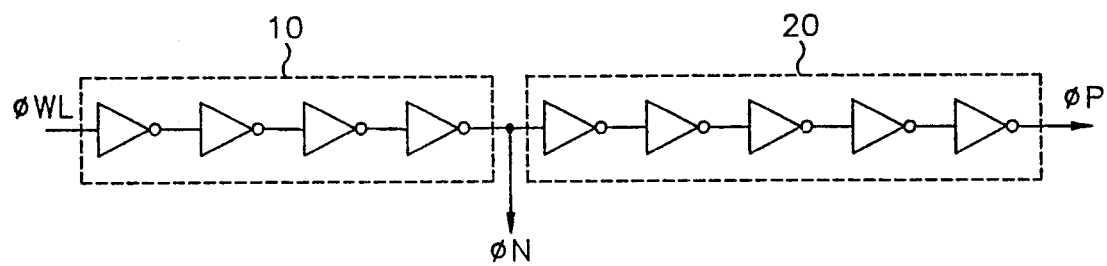
FIG. 2 is a schematic diagram of a sense amplifier control signal generation circuit according to prior art.
Figure 3:
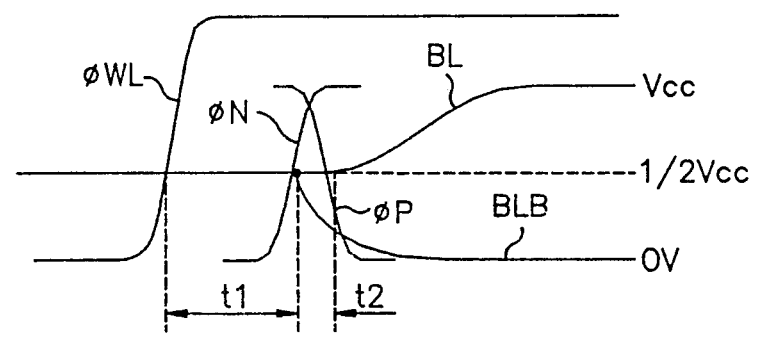
FIG. 3 is the operational waveforms of the sense amplifiers of FIG. 1 according to FIG. 2 in the data retention mode.
Figure 6:
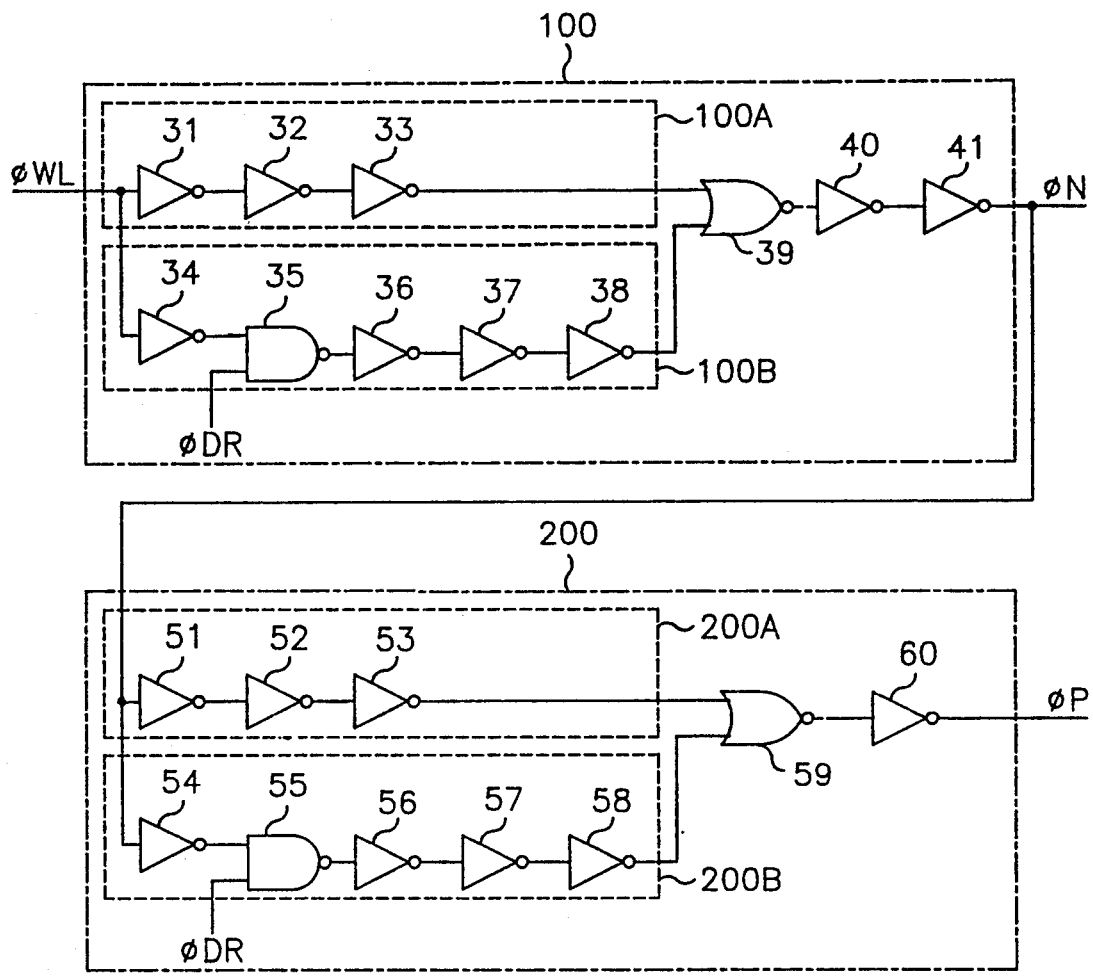
FIG. 6 is a schematic diagram for illustrating a sense amplifier control signal generation circuit according to the present invention.
Figure 7:
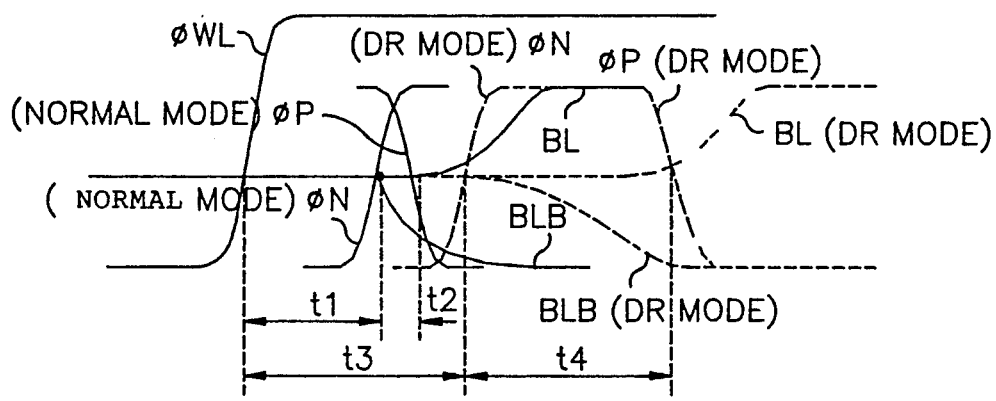
FIG. 7 is the operational waveforms of the sense amplifiers of FIG. 1 according to FIG. 6 in the data retention mode.

An operational waveform is shown in FIG. 7 for the sense amplifiers of FIG. 1 in data retention mode according to the sense amplifier control signal of the sense amplifier control signal generating circuit shown in FIG. 6.

The sense amplifier control signal generating circuit of the present invention comprises N- and P-type sense amplifier control signal generators 100 and 200. The N-type sense amplifier control signal generator 100 further comprises a normal mode enable circuit 100A having a delay means 31-33 for delaying a word line signal for a given time, a data retention mode enable circuit 100B for delaying the word line signal and provided with a switching circuit 35 controlled by the data retention mode detection signal $\phi DR$, and a $\phi N$ signal output means 39-41 for performing a NOR operation on the output signals of the normal and data retention mode enable circuits 100A and 100B to generate the $\phi N$ signal.

The P-type sense amplifier control signal generator 200 comprises a normal mode enable circuit 200A with a delay means 51-53 for delaying the $\phi N$ signal of the N-type sense amplifier control signal generator 100 for a given time, a data retention enable circuit 200B for delaying the $\phi N$ signal and provided with a switching circuit 55 controlled by the data retention mode detection signal $\phi DR$, and a $\phi P$ signal output means 59-60 for performing a NOR operation on the output signals of the normal and data retention mode enable circuits 200A and 200B to produce the $\phi P$ signal. As shown in FIG. 6, the N- and P-type sense amplifier signal generating circuits 100 and 200 have the same construction substantially.

Hereinafter, the operational characteristics of FIG. 1 will be described with reference to FIG. 7 according to the sense amplifier control signal of the present invention shown in FIG. 6. According to the present invention, the sense amplifier control signal generation circuit is switched by the data retention mode detection signal $\phi DR$ so as to make the delay time different between the word line signal $\phi WL$ and the signal $\phi N$ in the normal and data retention modes, respectively.

In normal mode, the data retention mode detection signal $\phi DR$ is in a low level, and therefore the data retention mode enable circuit 100B does not perform the delay function maintaining the output in low level. Hence, the normal mode enable circuit 100A determines the time interval from the word line enabling to the transition of the signal $\phi N$ to high level. In contrast, the signal $\phi DR$ is in a high level in the data retention mode, and therefore the data retention mode enable circuit 100B performs the delay function to delay the signal $\phi N$ of high level for the time interval which is between the point of $\phi DR$ transiting from the low to high level and the point of $\phi N$ transiting from the low to high level. Thus, the delay time between the enabling of the word line and the starting of the N-type sense amplifiers is increased in the data retention mode compared to the normal mode, so that operational gain is obtained for the low Vcc requiring more charge sharing time.

Likewise, the data retention mode enable circuit 200B which is the delay circuit is switched by the data retention mode detection signal $\phi DR$ so as to make the delay time different between the signal $\phi N$ for driving the N-type sense amplifiers and the signal $\phi P$ for driving the P-type sense amplifiers in the normal and data retention modes, respectively. In normal mode, the data retention mode detection signal $\phi DR$ is in a low level and therefore the data retention mode enable circuit 200B does not perform the delay function maintaining the output in a low level. Hence, the normal mode enable circuit 200A determines the time interval from the starting of the N-type sense amplifiers and the starting of the P-type sense amplifiers.

In contrast, the signal $\phi DR$ is in a high level in the data retention mode, and therefore the data retention mode enable circuit 200B performs the delay function to determine the time interval between the point of the $\phi N$ making a transition from a low to high level and the point of the signal $\phi P$ making a transition from a high to low level. Thus, the delay time between the starting of the N-type sense amplifiers and the starting of the P-type sense amplifiers is increased in the data retention mode compared to the normal mode, so that direct current flow is prevented. Direct current is caused by reducing the delay time to increase the operational speed in the prior art. The direct current flows from the voltage source terminal Vcc of the N-type sense amplifiers to the ground voltage terminal Vss of the P-type sense amplifiers.

In FIG. 7, solid lines indicate the normal mode operation and dotted lines indicate the data retention mode operation. The delay times t1 and t2 of the normal mode are varied increasingly into t3 and t4 in the data retention mode, respectively. The delay circuits are properly controlled so that the normal and data retention mode enable circuits 100A and 100B of the N-type sense amplifier control signal generator 100 respectively determine the delay times t1 and t2. The normal and data retention mode enable circuits 200A and 200B of the P-type sense amplifier control signal generator 200 respectively determine the delay times t3 and t4. In other words, the time interval between t3 and t1 is determined by the data retention mode enable circuit 100B, and the time interval between t4 and t2 is determined by the data retention mode enable circuit 100B. The time intervals t1 and t2 directly concern the access time of the memory cell data, and therefore, it is desirable to reduce them in the normal mode.

FIG. 6 is a preferred embodiment of the present invention where each delay circuit may comprise any number of inverters suited to the characteristics of the integrated circuit as well as resistors and capacitors.

As stated above, in the present invention, the sense amplifier control signal generating circuit generates a sense amplifier control signal having a delay time that differs in the normal and data retention modes. Data retention mode is performed without affecting the operational speed, charge sharing is sufficiently achieved in the data retention mode, and direct current flow is prevented.

While the invention has been shown in detail and described with reference to the preferred specific embodiment thereof, it will be apparent to those who are skilled in the art that in the foregoing changes in form and detail may be made without departing from the spirit and scope of the present invention.

I claim:

1. In a semiconductor memory device having a data retention function to retain data, a sense amplifier control signal generating circuit comprising:
   an N-type sense amplifier control signal means for generating an N-type signal, said N-type sense amplifier control signal means comprising:
   a first normal mode enable circuit; and,
   a first data retention mode enable circuit comprising:
      a first switching circuit controlled by a data retention mode detection signal for making a time interval between enabling of a word line and starting of said N-type sense amplifier control signal means longer in data retention mode than in normal mode; and,
      a first delay means comprising at least one inverter for delaying an output of said first switching circuit;
   a P-type sense amplifier control signal means for generating a P-type signal dependent on said N-type signal; said P-type sense amplifier control signal means comprising:
   a second normal mode enable circuit; and,
   a second data retention mode enable circuit comprising:
      a second switching circuit controlled by said data retention mode detection signal for making a time interval between enabling of said word line and starting of said P-type sense amplifier control signal means longer in said data retention mode than in said normal mode; and,
      a second delay means comprising at least one inverter for delaying an output of said second switching circuit.

2. A sense amplifier control signal generating circuit receiving a word line signal and comprising an N-type sense amplifier control signal generator (100) and a P-type sense amplifier control signal generator (200), said generating circuit comprising:
   said N-type sense amplifier control signal generator (100) comprising;
   a first enable circuit (100A) with a first delay means for delaying said word line signal for a given time;
   a second enable circuit (100B) for delaying said word line signal and provided with a first switching circuit (35) controlled by a data retention mode detection signal ($\phi$DR); and
   a first output means (39-41) for performing a logical operation on the output signals of said first and second enable circuits (100A, 100B) to generate an N-type sense amplifier control signal; and
   said P-type sense amplifier control signal generator (200) comprising;
   a third enable circuit (200A) with a second delay means for delaying said N-type amplifier control signal for a given time;
   a fourth enable circuit (200B) for delaying said N-type sense amplifier control signal and provided with a second switching circuit (55) controlled by said data retention mode detection signal ($\phi$DR); and
   a second output means (59-60) for performing a logical operation on the output signals of said third and fourth enable circuits (200A, 200B) to produce a P-type sense amplifier control signal.

3. A sense amplifier control signal generating circuit as claimed in claim 2, wherein said first and second delay means comprise at least one inverter.

4. A sense amplifier control signal generating circuit as claimed in claim 2, wherein only said first and third enable circuits are enabled in normal mode, and said first to fourth enable circuits are enabled in data retention mode.

5. A sense amplifier control signal generating circuit as claimed in claim 2, wherein the outputs of said second and fourth enable circuits are enabled in data retention mode.

6. A sense amplifier control signal generating circuit as claimed in claim 2, wherein said first and second output means comprise a NOR gate, and said logical operation of said first and second output means is performed by said NOR gate.

7. A sense amplifier control signal generating circuit comprising a first-type sense amplifier control signal generator and a second-type sense amplifier control signal generator, said generating circuit comprising:
   said first-type sense amplifier control signal generator comprising;
   a first enable circuit with a first delay means for delaying a given input signal for a given time;
   a second enable circuit for delaying said input signal and provided with a first switching circuit controlled by a data retention mode detection signal ($\phi$DR); and
   a first output means for performing a logical operation on the output signals of said first and second enable circuits to generate a first-type sense amplifier control signal; and
   said second-type sense amplifier control signal generator comprising;
   a third enable circuit with a second delay means for delaying said first-type amplifier control signal for a given time;
   a fourth enable circuit for delaying said first-type sense amplifier control signal and provided with a second switching circuit controlled by said data retention mode detection signal ($\phi$DR); and
   a second output means for performing a logical operation on the output signals of said third and fourth enable circuits to produce a second-type sense amplifier control signal.

* * * * *